(12) United States Patent
Honda et al.

(10) Patent No.: US 11,922,985 B2
(45) Date of Patent: Mar. 5, 2024

(54) MAGNETIC MEMORY DEVICE AND MAGNETIC MEMORY APPARATUS

(71) Applicant: Samsung Electronics Co., Ltd., Suwon-si (KR)

(72) Inventors: Syuta Honda, Shimamoto town (JP); Yoshiaki Sonobe, Fujisawa (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 233 days.

(21) Appl. No.: 17/487,557

(22) Filed: Sep. 28, 2021

(65) Prior Publication Data

US 2022/0108738 A1 Apr. 7, 2022

(30) Foreign Application Priority Data

Oct. 1, 2020 (JP) .................................. 2020-167192
Jun. 28, 2021 (KR) ......................... 10-2021-0084162

(51) Int. Cl.
*G11C 11/16* (2006.01)
*H01F 10/32* (2006.01)
(Continued)

(52) U.S. Cl.
CPC ........ *G11C 11/161* (2013.01); *G11C 11/1673* (2013.01); *G11C 11/1697* (2013.01); *H01F 10/3286* (2013.01); *H10B 61/00* (2023.02); *H10N 50/10* (2023.02); *H10N 50/80* (2023.02); *H10N 50/85* (2023.02)

(58) Field of Classification Search
CPC .............. G11C 11/161; G11C 11/1673; G11C 11/1697; G11C 11/1675; H01F 10/3286; H01F 10/3222; H01F 10/3254; H01F 10/329; H10B 61/00; H10N 50/10; H10N 50/80; H10N 50/85
See application file for complete search history.

(56) References Cited

U.S. PATENT DOCUMENTS 10,916,480 B2   2/2021   Sasaki et al.
10,964,369 B2   3/2021   Shibata
(Continued)

FOREIGN PATENT DOCUMENTS

JP   2008-166787 A   7/2008
JP   2017-112351 A   6/2017
(Continued)

OTHER PUBLICATIONS

Nobuhiro Kinoshita, et al. "Methods for Stable Reproduction in Holographic Memory" No. 160, pp. 39-52 (2016).
(Continued)

*Primary Examiner* — Xiaochun L Chen
(74) *Attorney, Agent, or Firm* — Harness, Dickey & Pierce, P.L.C.

(57) ABSTRACT

A magnetic memory device is provided. The magnetic memory device includes a spin orbit torque (SOT) source configured to generate SOT, and a magnetic fine wire of which one end contacts a main surface of the SOT source. A direction of SOT generated by the SOT source is perpendicular to a direction in which the magnetic fine wire extends, and a magnetic domain in the magnetic fine wire is parallel to the direction in which the magnetic fine wire extends.

19 Claims, 14 Drawing Sheets

(51) Int. Cl.
  *H10B 61/00* (2023.01)
  *H10N 50/10* (2023.01)
  *H10N 50/80* (2023.01)
  *H10N 50/85* (2023.01)

(56) References Cited

U.S. PATENT DOCUMENTS

| | | | | |
|---|---|---|---|---|
| 2018/0114898 | A1* | 4/2018 | Lee | G11C 11/1659 |
| 2020/0294565 | A1* | 9/2020 | Apalkov | G11C 11/1675 |
| 2021/0125652 | A1 | 4/2021 | Honda et al. | |
| 2021/0125653 | A1 | 4/2021 | Sonobe et al. | |
| 2021/0126189 | A1 | 4/2021 | Sonobe et al. | |
| 2022/0406993 | A1* | 12/2022 | Hamanaka | H01L 29/82 |

FOREIGN PATENT DOCUMENTS

| | | |
|---|---|---|
| JP | 2017-168514 A | 9/2017 |
| JP | 2018-182291 A | 11/2018 |
| JP | 2020-53532 A | 4/2020 |
| JP | 2021-072138 A | 5/2021 |
| JP | 2021-072317 A | 5/2021 |
| JP | 2021-072318 A | 5/2021 |
| WO | WO-2018-189964 A1 | 10/2018 |

OTHER PUBLICATIONS

Stuart S. P. Parkin, et al., "Magnetic Domain—Wall Racetrack Memory" Science vol. 320, www.sciencemag.org <http://www.sciencemag.org>., pp. 190-194 (2008).

H. Tanigawa et. al., "Operating principle of a three-terminal domain wall device with perpendicularly magnetized Ta/CoFeB/MgO free layer and underlying hard magnets", The Japan Society of Applied Physics, vol. 53, pp. 063002-1-063002-7 (2014).

I.M. Miron et al. "Perpendicular switching of a single ferromagnetic layer induced by in-plane current injection", Nature, vol. 476, pp. 189-194 (2011).

Luqiao Liu et al., "Spin-Torque Switching with the Giant Spin Hall Effect of Tantalum", Science, vol. 336, www.sciencemag.org pp. 555-558 (2012).

S. C. Baek et al., "Spin currents and spin-orbit torques in ferromagnetic trilayers", Nature Materials, vol. 17, pp. 509-513 (2018).

H. Yoda et al, "Voltage-Control Spintronics Memory (VoCSM) Having Potentials of Ultra-Low Energy-Consumption and High-Density", IEEE, pp. 27.6.1-27.6.4 (2016).

S. Fukami et al., "Low-Current Perpendicular Domain Wall Motion Cell for Scalable High-Speed MRAM", Symposium on VLSI Technology Digest of Technical Papers, pp. 230-231 (2009).

* cited by examiner

114

114b

MAGNETIC MEMORY DEVICE AND MAGNETIC MEMORY APPARATUS

CROSS-REFERENCE TO RELATED APPLICATIONS

This application claims the benefit of Japanese Patent Application No. 2020-167192, filed on Oct. 1, 2020, in the Japanese Patent Office and Korean Patent Application No. 10-2021-0084162, filed on Jun. 28, 2021, in the Korean Intellectual Property Office, the disclosures of each of which are incorporated herein in their entireties by reference.

BACKGROUND

Inventive concepts relate to a magnetic memory device and a magnetic memory apparatus.

In large capacity non-volatile memory represented by NAND flash memory, due to development of three-dimensional technology, recording capacity is increasing. However, because semiconductor memory records information, for example by by the presence of or absence of charges in a memory cell, time to physically move electrons is used/required.

On the other hand, magnetic memory may essentially implement short time record, for example within dozens of picoseconds. Limited to recording time, magnetic memory may have a speed 10 to 20 times higher than that of other semiconductor memory. Alternatively or additionally, recently, in a one-dimensional structure referred to as a magnetic fine wire obtained by processing a magnetic material to a straight line of hundreds of nanometers, a phenomenon in which a magnetic domain wall is driven by applying a current (a magnetic domain wall current driving phenomenon) has been observed. Electric access to magnetization information by using the phenomenon is tried.

Race track memory may be an original memory wherein a U-shaped three dimensional structure is obtained by extending a magnetic fine wire in a vertical direction. In the memory, information is moved to a read head by generating a magnetic domain by a record head in the magnetic fine wire and applying a pulse current from side to side. When information to be read is provided at an end, a function of random access may be implemented although it takes some time. Data is read by a magnetic tunnel junction (MTJ) device.

SUMMARY

Inventive concepts relate to a magnetic memory device and/or a magnetic memory apparatus with high density, high capacity, and/or high reliability.

According to some example embodiments of inventive concepts, there is provided a magnetic memory device including a spin orbit torque (SOT) source configured to generate SOT, and a magnetic fine wire having an end contacting a main surface of the SOT source. A direction of SOT generated by the SOT source is perpendicular to a direction in which the magnetic fine wire extends, and a magnetic domain in the magnetic fine wire is parallel to the direction in which the magnetic fine wire extends.

According to some example embodiments of inventive concepts, there is provided a magnetic memory apparatus including a spin orbit torque (SOT) source extending in a horizontal direction, a first electrode at one end of the SOT source and a second electrode at another end of the SOT source, a magnetic fine wire extending on the SOT source in a direction perpendicular to the horizontal direction, at least one of an insulating layer or a non-magnetic metal layer, the insulating layer or the non-magnetic metal layer on an upper end of the magnetic fine wire, a fixed layer on the insulating layer or the non-magnetic metal layer, a third electrode on the fixed layer, and controller circuitry electrically connected to the first electrode, the second electrode, and the third electrode.

According to some example embodiments of inventive concepts, there is provided a magnetic memory apparatus including a spin orbit torque (SOT) source configured to generate SOT, a magnetic fine wire on the SOT source, a first electrode and a second electrode, the first electrode and the second electrode configured to flow a current to the SOT source in a direction perpendicular to a direction of the SOT, a third electrode configured to flow a current to the magnetic fine wire in a direction parallel to a direction in which the magnetic fine wire extends, and controller circuitry connected to the first electrode, the second electrode, and the third electrode.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF EXAMPLE EMBODIMENTS

Figure 1:
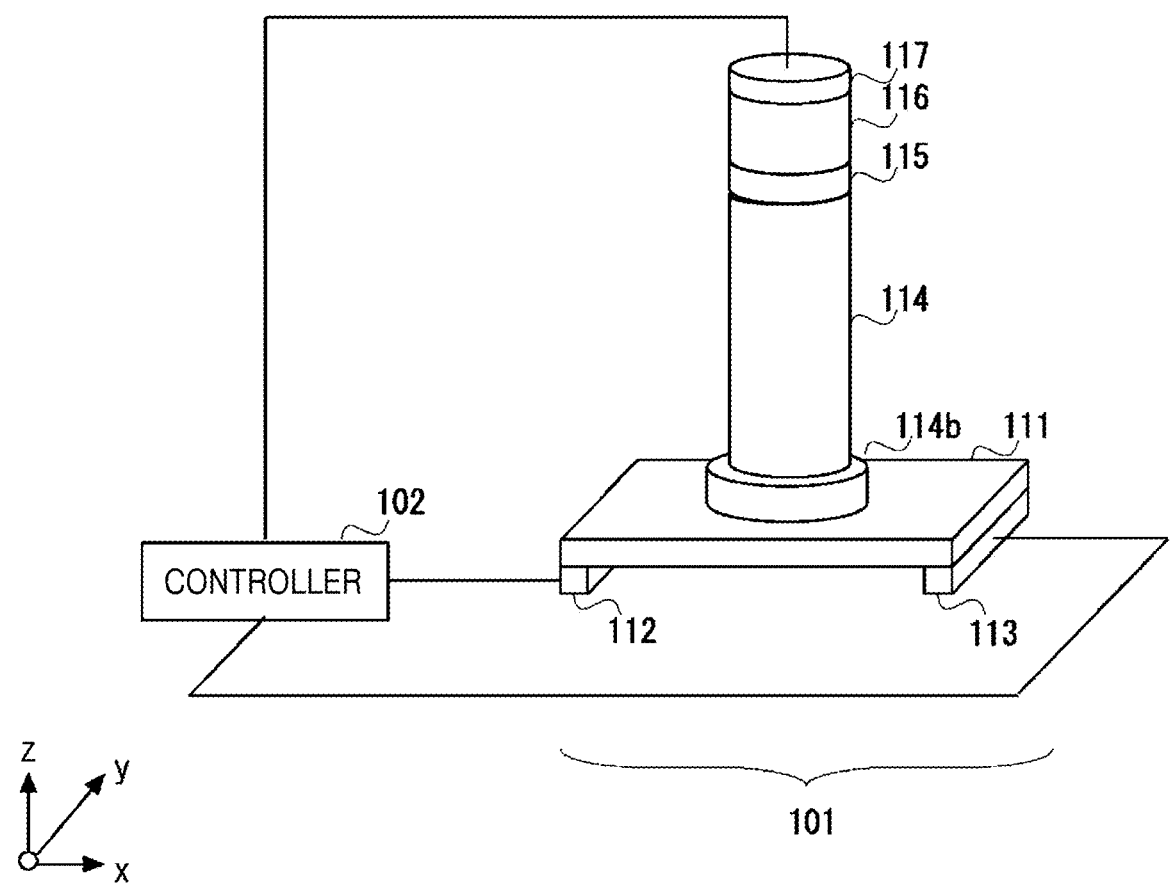
FIG. 1 is a view of a magnetic memory apparatus according to some example embodiments of inventive concepts.

Hereinafter, some example embodiments of inventive concepts will be described with reference to the accompanying drawings. FIG. 1 is a view of a magnetic memory apparatus 100 according to some example embodiments of inventive concepts. In FIG. 1, a structure of a magnetic memory device 101 is represented as a perspective view and a circuit connected to the magnetic memory device 101 is represented as a schematic view.

Referring to FIG. 1, a memory apparatus 100 includes a magnetic memory device 101 and a controller 102. The magnetic memory device 101 includes a spin orbit torque (SOT) source 111, a first electrode 112, a second electrode 113, a magnetic fine wire 114, an insulating layer 115, a fixed layer 116, and a third electrode 117. As illustrated in FIG. 1, the SOT source 111, the magnetic fine wire 114, the insulating layer 115, and the fixed layer 116 are sequentially stacked, e.g. are stacked in a vertical direction such as the z-direction. The first electrode 112 and the second electrode 113 may be separated by a distance, such as a distance measured in a horizontal direction (an x direction).

The SOT source 111 is an electrode generating SOT. The magnetic fine wire 114 contacts (e.g. directly contacts) a main surface of the SOT source 111, such as approximately in the z direction. In addition, the SOT source 111 generates the SOT in a direction approximately perpendicular to the main surface of the SOT source 111, e.g. perpendicular to the direction in which an x direction and a y direction extend. Then, the SOT source 111 generates the SOT in a lower portion 114b of the magnetic fine wire 114. Directions of magnetization recorded in the magnetic fine wire 114 by the SOT generated by the SOT source 111 in the lower portion 114b of the magnetic fine wire 114 and a current flowing through the magnetic fine wire 114 correspond to stored information. In FIG. 1, the SOT is in a y axis direction and a direction of magnetization of the lower portion 114b of the magnetic fine wire 114 changes by the direction of the SOT. For example, the direction of the SOT generated by the SOT source 111 is perpendicular to the direction of the magnetization recorded in the magnetic fine wire 114, and the direction of the magnetization is parallel with a direction in which the magnetic fine wire 114 extends. Furthermore, in FIG. 1, a diameter of the lower portion 114b of the magnetic fine wire 114 is illustrated as being different from a diameter of the magnetic fine wire 114. However, the diameter of the lower portion 114b of the magnetic fine wire 114 may be different from or equal to the diameter of the magnetic fine wire 114. Furthermore the lower portion 114b may not have a circular shape, and may have an elliptical shape; however, example embodiments are not limited thereto.

The SOT source 111 may generate the SOT by flowing a current between the first electrode 112 and the second electrode 113, e.g. in a horizontal direction such as in the x direction. The SOT source 111 may commonly be a non-magnetic metal. For example, the SOT source 111 may include a topological insulator. The topological insulator is or includes a material of which the inside is an insulator and a surface is conductive. For example, the topological insulator may include semimetal bismuth and/or a bismuth compound. In particular, BiTeSb and/or BiSb may be a suitable or a very suitable material for the topological insulator. An inside of the topological insulator may have conductivity type, such as P-type or N-type, by changing a composition. Alternatively or additionally, the SOT source 111 may include at least one metal among rhodium (Rh), platinum (Pt), tungsten (W), and tantalum (Ta).

Alternatively or additionally, the SOT source 111 may include a combination of a magnetic material such as NiFe or CoFeB as a ferromagnetic body and titanium (Ti).

The first electrode 112 contacts (e.g. directly contacts) one end of the SOT source 111. The second electrode 113 contacts (e.g. directly contacts) another end of the SOT source 111. In addition, the first electrode 112 and the second electrode 113 are connected to the controller 102, for example by electric wiring lines. Although FIG. 1 illustrates that the first electrode 112 and the second electrode 113 are below the SOT source 111, example embodiments are not limited thereto. For example, at least one of the first electrode 112 or the second electrode 113 may be on top of the SOT source 111, and/or on a side of the SOT source 111.

The magnetic fine wire 114 is or includes a magnetic body having magnetic anisotropy. One end of the magnetic fine wire 114 contacts or directly contacts the SOT source 111, and another end of the magnetic fine wire 114 contacts or directly contacts the insulating layer 115. In FIG. 1, the magnetic fine wire 114 extends in a vertical direction, e.g. in the z-axis direction. For example, the extension direction of the magnetic fine wire 114 is perpendicular to the direction of the SOT generated by the SOT source 111 and parallel with the direction of the magnetization.

The magnetic fine wire 114 may be or correspond to a pillar-type magnetic fine wire. The magnetic fine wire 114 may include a ferromagnetic metal. The magnetic fine wire 114 may be made of a slender magnetic body. A current may flow in the magnetic fine wire 114, and the magnetic fine wire 114 may function as magnetic domain wall movable memory in which a magnetic domain wall (a boundary between sections of constant magnetization directions) moves. For example, a current may flow in the magnetic fine wire 114 so that spin transfer torque (STT) is generated. A current may flow to the SOT source 111 arranged under an end of the magnetic fine wire 114 so that the SOT is generated in the lower portion 114b of the magnetic fine wire 114. By using the STT and the SOT together, a magnetic domain wall and/or a magnetic domain is recorded in the magnetic fine wire 114.

For example, the magnetic fine wire 114 may include at least one of a cobalt (Co)/nickel (Ni) multilayer, a CoNi-based alloy, a Co/palladium (Pd) multilayer, a CoPd alloy, a Co/Pt multilayer, a CoPt alloy, a terbium (Tb)/iron (Fe)Co multilayer, a TbFeCo alloy, a CoFe alloy, a CoFeB alloy, a Fe/Ni multilayer, or a FeNi alloy.

The magnetic fine wire 114 may have various shapes. The magnetic fine wire 114 illustrated in FIG. 1 may be made of a slender magnetic body and extends on a straight line (here, a Z axis). A cross-section of the magnetic fine wire 114 may have various shapes. For example, the cross-section of the magnetic fine wire 114 may be circular or elliptical or square or polygonal.

One end of the insulating layer 115 structurally contacts (e.g. directly contacts) the magnetic fine wire 114. In addition, the insulating layer 115 is a non-magnetic insulator. For example, a main component of the insulating layer 115 may be or may include an insulating material. The insulating layer 115 includes an insulating layer such as magnesium oxide (MgO). A material of the insulating layer 115 may be oxide having a sodium chloride (NaCl) structure, e.g. may have a cubic unit cell. The material of the insulating layer 115 may be at least one of calcium oxide (CaO), strontium oxide (SrO), titanium oxide (TiO), vanadium oxide (VO), or niobium oxide (NbO) in addition to or alternatively to MgO. However, the material of the insulating layer 115 is not limited thereto, for example unless a function thereof deteriorates. For example, spinel-type $MgAl_2O_4$ may alternatively or additionally be used as the material of the insulating layer 115. In some example embodiments as in FIG. 1, the magnetic fine wire 114, the insulating layer 115, and the fixed layer 116 form a tunnel magneto-resistance (TMR) device. However, alternatively, a giant magneto-resistance (GMR) device may include a metal such as copper (Cu) instead of or in addition to the insulating layer 115.

The fixed layer 116 is or includes a ferromagnetic body having perpendicular magnetic anisotropy. For example, the fixed layer 116 is parallel with the extension direction of the magnetic fine wire 114 and has magnetic anisotropy. One end of the fixed layer 116 structurally contacts (e.g. directly contacts) the insulating layer 115. Another end of the fixed layer 116 contacts (e.g. directly contacts) the third electrode 117. The fixed layer 116 is a ferromagnetic metal layer with a fixed direction of magnetization. For example, the fixed layer 116 may include a Fe-based material such as CoFeB or CoFe, the Co/Pt multilayer, or a combination of the Fe-based material and the Co/Pt multilayer. The magnetic fine wire 114, the insulating layer 115, and the fixed layer 116 form the TMR device.

The third electrode 117 contacts (e.g. directly contacts) the fixed layer 116. In addition, the third electrode 117 is connected to the controller 102, for example by an electric wiring line.

The controller 102 records and/or reads information into and/or from the magnetic memory device 101. The controller 102 moves information in the magnetic fine wire 114. Such operations are performed by the controller 102 applying a voltage and/or flowing current among the first electrode 112, the second electrode 113, and the third electrode 117.

The controller 102 may include a current source and/or a voltage source and/or a current meter or ammeter and/or a voltage meter or voltmeter and/or a voltammeter. Additionally or alternatively, the controller 102 may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The controller 102 may be connected to other components such as to a host (not shown); the host may request reading of and/or writing to the magnetic memory device 101.

The controller 102 may cause a change a direction of the current flowing between the first electrode 112 and the second electrode 113 in accordance with information to be recorded/stored. For example, when binary '0' is to be recorded in the magnetic memory device 101, the controller 102 may flow the current from the first electrode 112 to the second electrode 113. When binary '1' is to be recorded in the magnetic memory device 101, the controller 102 flows the current from the second electrode 113 to the first electrode 112. Alternatively, when the binary '1' is to be recorded in the magnetic memory device 101, the controller 102 flows the current from the first electrode 112 to the second electrode 113. When the binary '0' is to be recorded in the magnetic memory device 101, the controller 102 flows the current from the second electrode 113 to the first electrode 112.

Alternatively or additionally, the controller 102 may read the direction of the magnetization (for example, a value of the recorded information) of the magnetic fine wire 114 by applying a constant voltage (a DC voltage) between the first electrode 112 and the third electrode 117 and measuring a value of the current flowing between the third electrode 117 and the first electrode 112.

Additionally or alternatively, the controller 102 may read the direction of the magnetization (for example, the value of the recorded information) of the magnetic fine wire 114 by flowing a constant current (a sensing current) between the first electrode 112 and the third electrode 117 and measuring the voltage (a potential difference) between the first electrode 112 and the third electrode 117.

FIGS. 2 to 6 are views illustrating an operation of a magnetic memory apparatus according to some example embodiments of inventive concepts.

Figure 2:
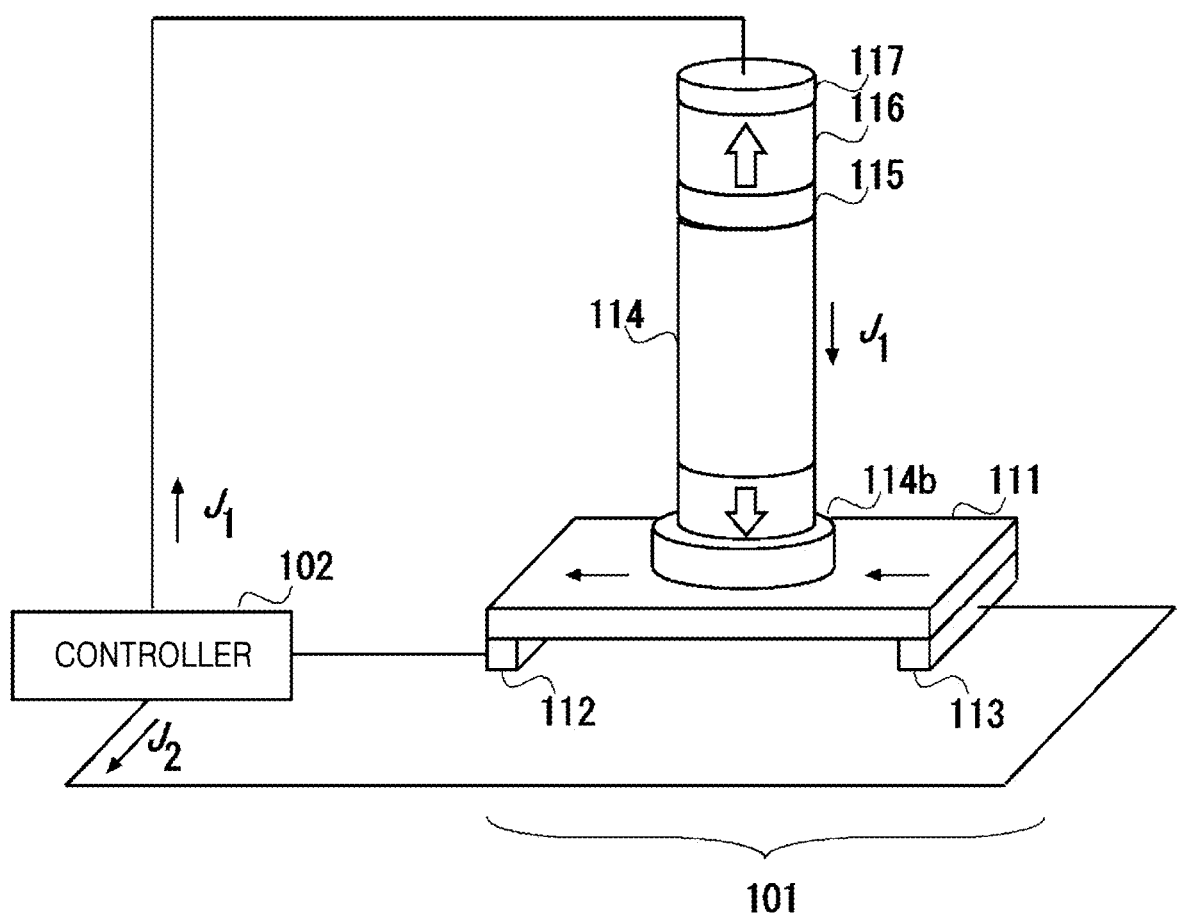
FIG. 2 is a view illustrating an operation of a magnetic memory apparatus according to some example embodiments of inventive concepts.

Referring to FIG. 2, initiation of recording information on a first bit is described. In FIG. 2, when the controller 102 causes a flow of a current $J_2$ in a direction corresponding to the information on the first bit between the first electrode 112 and the second electrode 113, the SOT in a y axis direction may be generated by the SOT source 111 in the lower portion 114b of the magnetic fine wire 114. In the example of FIG. 2, the current $J_2$ flows from the second electrode 113 to the first electrode 112, and a magnetic domain wall is formed in the lower portion 114b of the magnetic fine wire 114.

Figure 3:
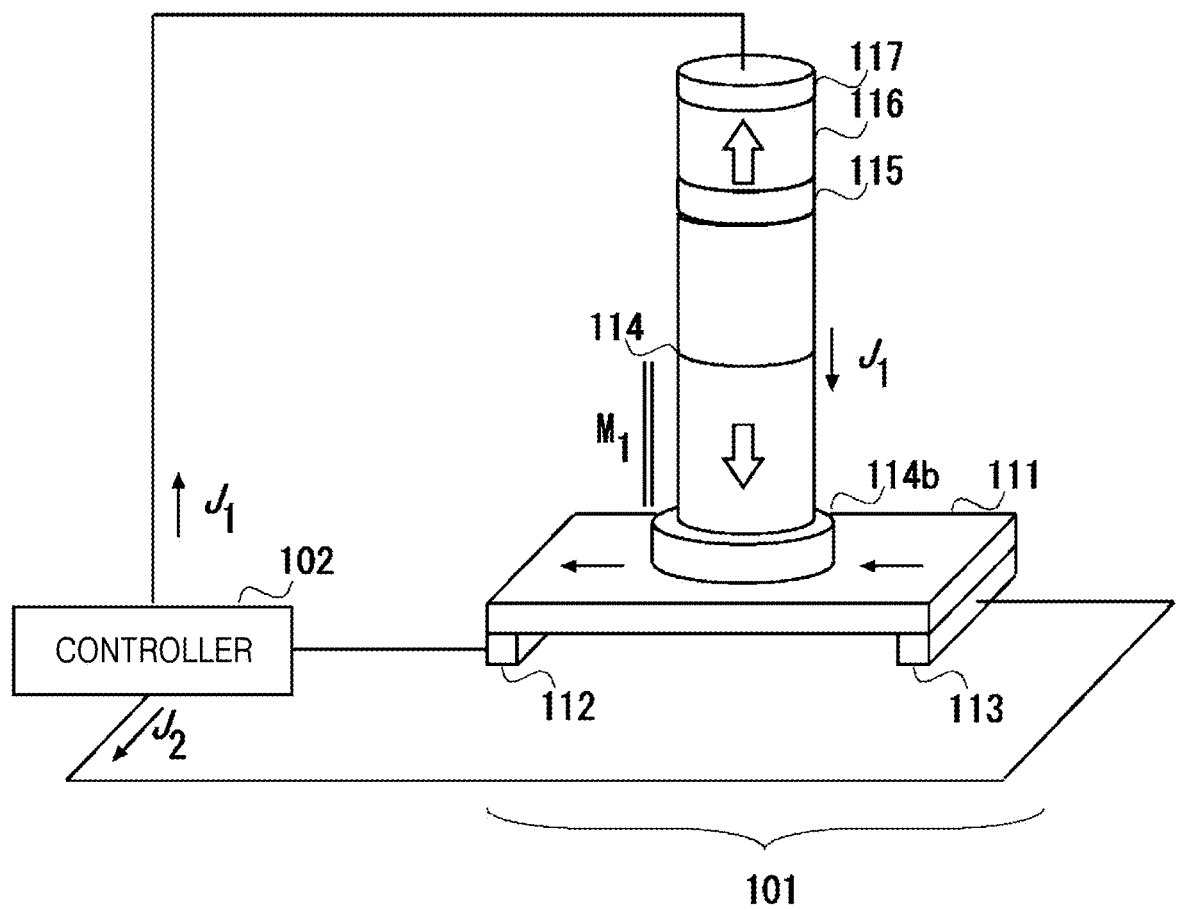
FIG. 3 is a view illustrating an operation of a magnetic memory apparatus according to some example embodiments of inventive concepts.

The generated magnetic domain wall may move, e.g. may move upward along the magnetic fine wire 114 by the controller 102 flowing a current $J_1$ from the third electrode 117 to the first electrode 112. Referring to FIG. 3, a state in which recording of the information on the first bit is completed is illustrated. As illustrated in FIG. 3, downward magnetization $M_1$ is recorded in the magnetic fine wire 114 with a length corresponding to one bit.

Figure 4:
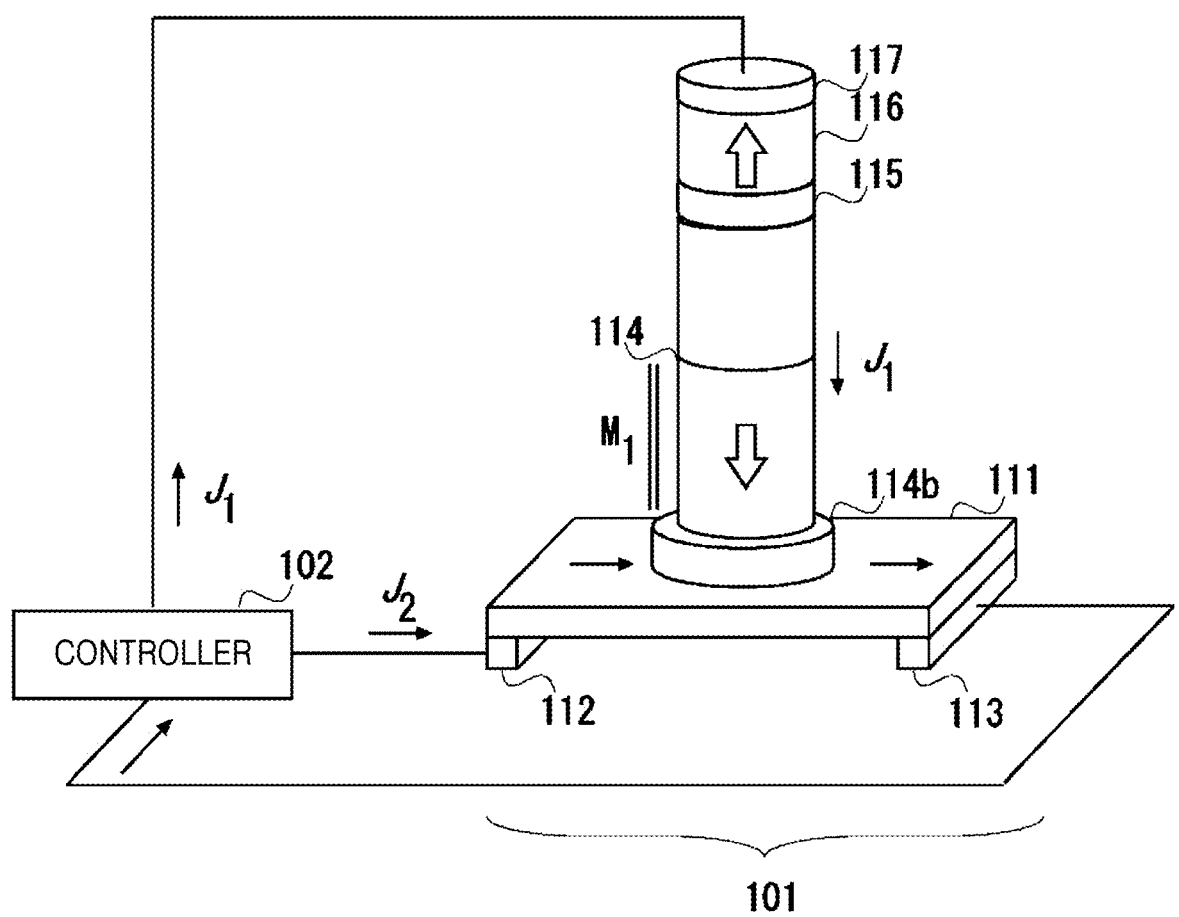
FIG. 4 is a view illustrating an operation of a magnetic memory apparatus according to some example embodiments of inventive concepts.

Next, referring to FIG. 4, initiation of recording/storing information on a second bit is described. In FIG. 4, when the controller 102 flows the current $J_2$ in a direction corresponding to the information on the second bit between the first electrode 112 and the second electrode 113, the SOT is generated by the SOT source 111 in the lower portion 114b of the magnetic fine wire 114. In FIG. 4, the current $J_2$ flows from the first electrode 112 to the second electrode 113 and the SOT is generated in a direction opposite to/antiparallel to that described in FIG. 2 so that the magnetic domain wall is formed in the lower portion 114b of the magnetic fine wire 114.

Figure 5:
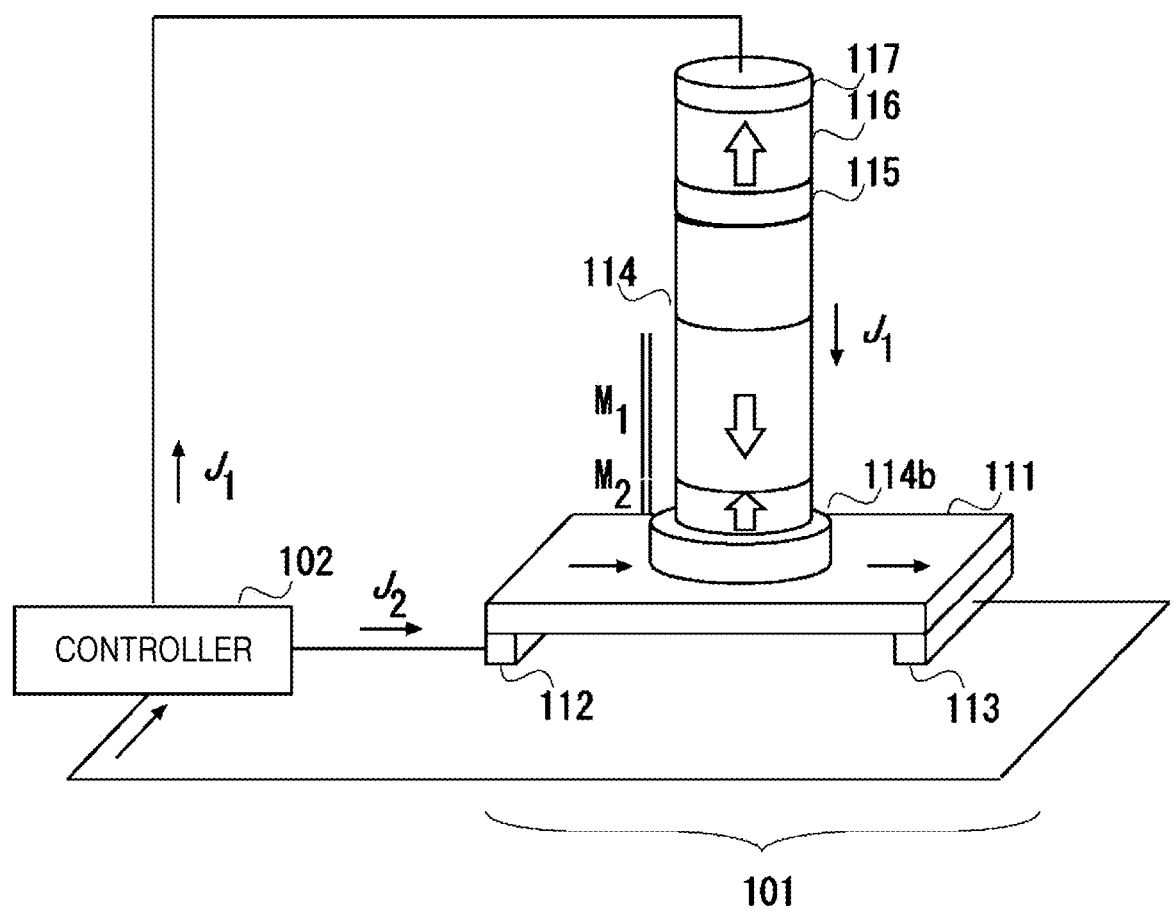
FIG. 5 is a view illustrating an operation of a magnetic memory apparatus according to some example embodiments of inventive concepts.

When the controller 102 flows the current $J_1$ from the third electrode 117 to the first electrode 112, the magnetization $M_1$ corresponding to the information on the first bit moves closer to the third electrode 117, and the magnetic domain wall generated in the lower portion 114b of the magnetic fine wire 114 moves to the magnetic fine wire 114. Referring to FIG. 5, the downward magnetization $M_1$ of the first bit moves to the third electrode 117 in the magnetic fine wire 114, and upward magnetization $M_2$ of the second bit moves to the magnetic fine wire 114.

Figure 6:
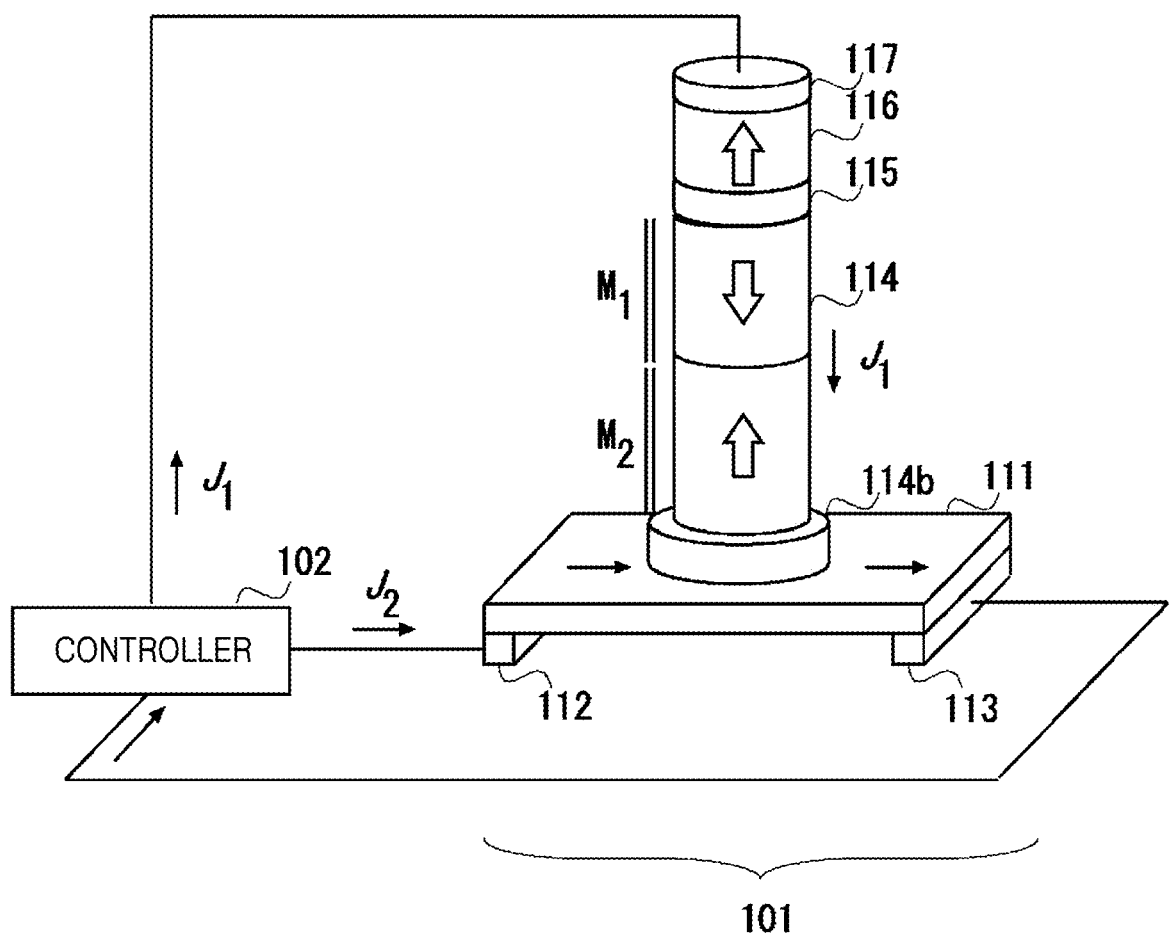
FIG. 6 is a view illustrating an operation of a magnetic memory apparatus according to some example embodiments of inventive concepts.

Referring to FIG. 6, a state in which recording/storing of the information on the second bit is completed is illustrated. As illustrated in FIG. 6, the upward magnetization $M_2$ is recorded in the magnetic fine wire 114 with the length corresponding to one bit.

Figure 7:
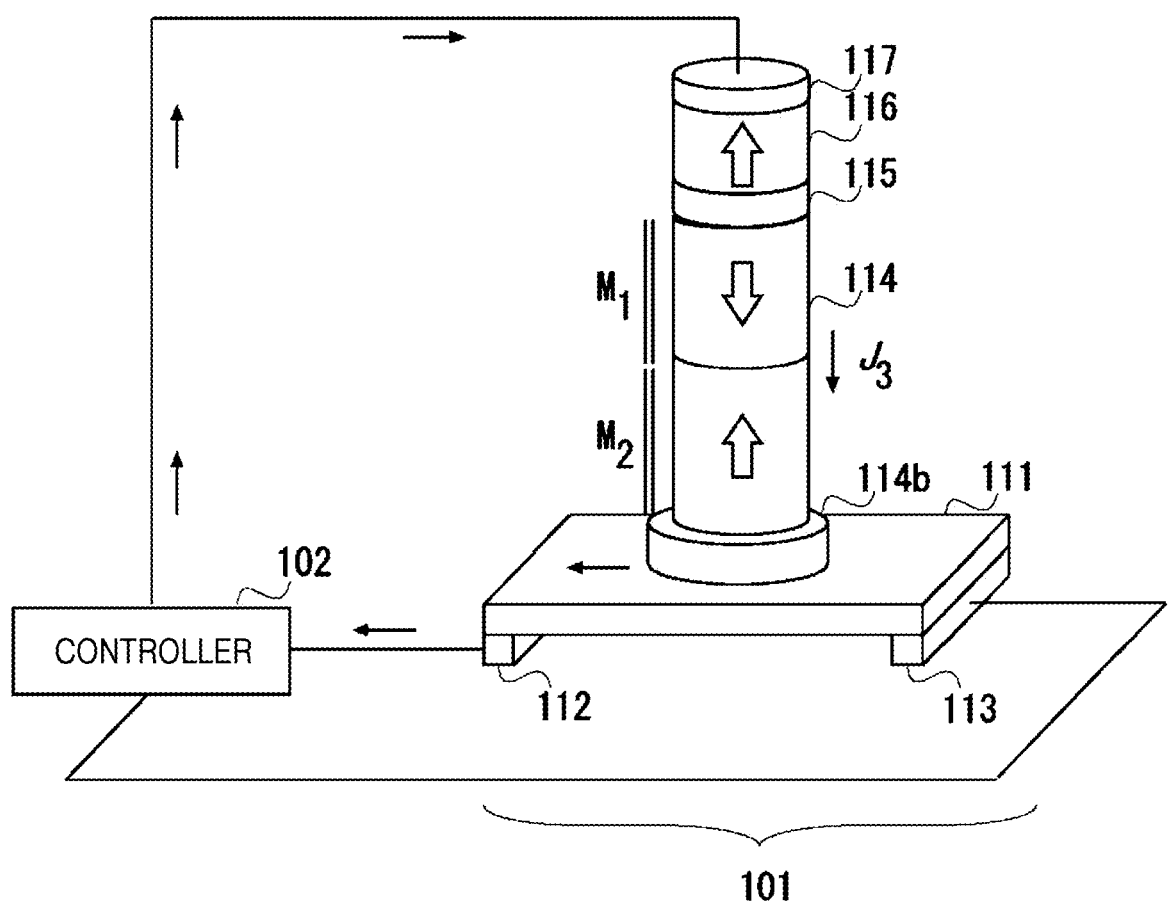
FIG. 7 is a view illustrating an operation of a magnetic memory apparatus according to some example embodiments of inventive concepts.

FIG. 7 is a view illustrating an operation of a magnetic memory apparatus according to some example embodiments of inventive concepts.

Referring to FIG. 7, the controller 102 may read the direction of the magnetization at an upper end of the magnetic fine wire 114 (for example, a value of information recorded at the uppermost side 115 of the magnetic fine wire 114) by applying a constant voltage or a DC voltage between the first electrode 112 and the third electrode 117, and measuring a value of a current $J_3$ flowing between the third electrode 117 and the first electrode 112.

Alternatively or additionally, the controller 102 reads the direction of the magnetization at an upper end of the magnetic fine wire 114 (for example, a value of information/bits recorded at the uppermost side 115 of the magnetic fine wire 114) by flowing a constant current (a DC current) between the first electrode 112 and the third electrode 117, and measuring the voltage (or the potential difference) between the first electrode 112 and the third electrode 117.

The controller 102 reads second information by moving the magnetization of the magnetic fine wire 114 upward (e.g. in the vertical z-direction) with a constant current, and moving the second information closer to the third electrode 117. As described above, third and fourth information items may be sequentially read.

In addition, when the third and fourth information items (e.g. the third and fourth bits) are sequentially read, the controller 102 does not flow a current (and/or does not apply a voltage) between the first electrode 112 and the second electrode 113.

As described above, the magnetic memory apparatus 100 may move the magnetic domain wall (the boundary between the sections in the constant magnetization directions) by using the STT and the SOT together. The magnetic fine wire 114 may function as magnetic domain wall movable memory.

Next, the probability in which recording capacity of a magnetic device according to inventive concepts is equal to or greater than that of next generation vertical NAND (V-NAND) memory is investigated. In micro-magnetics simulation based on the Landau-Lifshitz-Gilbert (LLG) equation, a length of the magnetic fine wire is set as 200 nm, a width of the magnetic fine wire is set as 10 nm, and a stripe-shaped magnetic domain structure obtained by magnetizing information of 10 bits is written as an initial state. As a result of performing micro-magnetics simulation with magnetic parameters such as saturation magnetization Ms: 300 kA/m, an exchange stiffness integer: 1.0 pJ/m, vertical magnetic anisotropy: 100 kJ/m3, and a DMI integer: 0.015 mJ/m2, a state is stable with the number of bits in the initial state maintained. Therefore, information of, for example, up to 500 bits may be stored in the magnetic fine wire with a length of 10 μm. The memory capacity is one to two times the recording capacity of V-NAND memory with a height of 10 μm, a diameter of 150 nm, and 96 layers.

A calculator experiment may be performed on an operation of the magnetic memory device 101 illustrated in FIG. 1 by using the LLG equation assuming Permalloy composition of the memory device 101 (e.g. an FeNi alloy). The result of performing the calculator experiment is illustrated in FIGS. 8 to 14. FIGS. 8 to 14 are views illustrating examples of a calculation result obtained by using the LLG equation.

Figure 8:
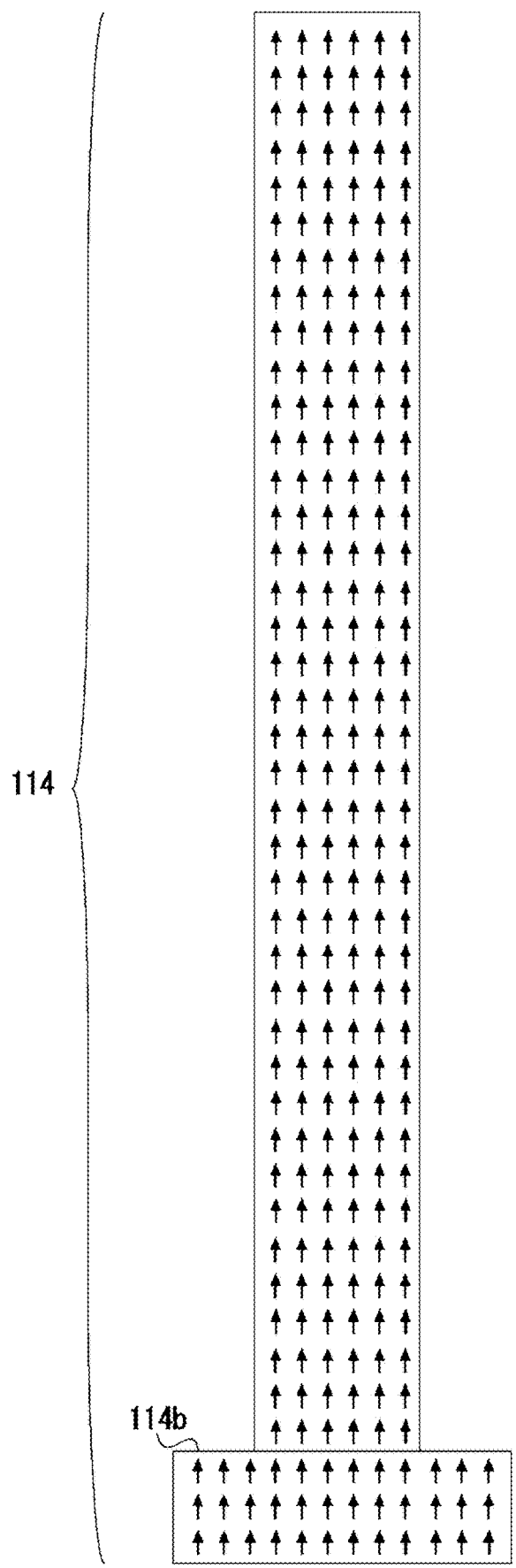
FIG. 8 is a view illustrating an example of a calculation result using the Landau-Lifshitz-Gilbert (LLG) equation.
Figure 9:
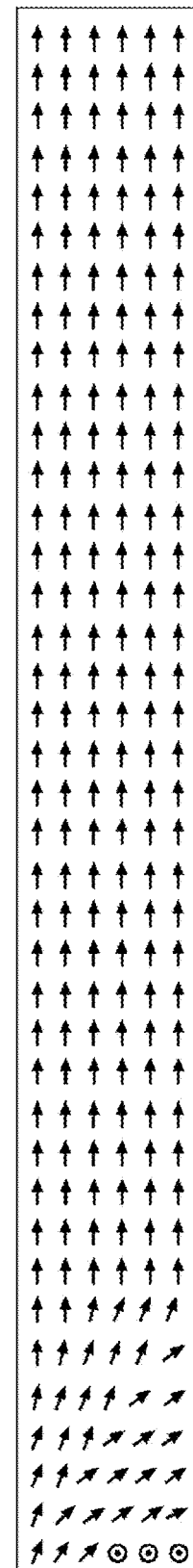
FIG. 9 is a view illustrating an example of a calculation result using the LLG equation.
Figure 9:
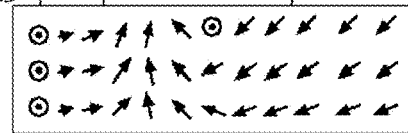
Figure 10:
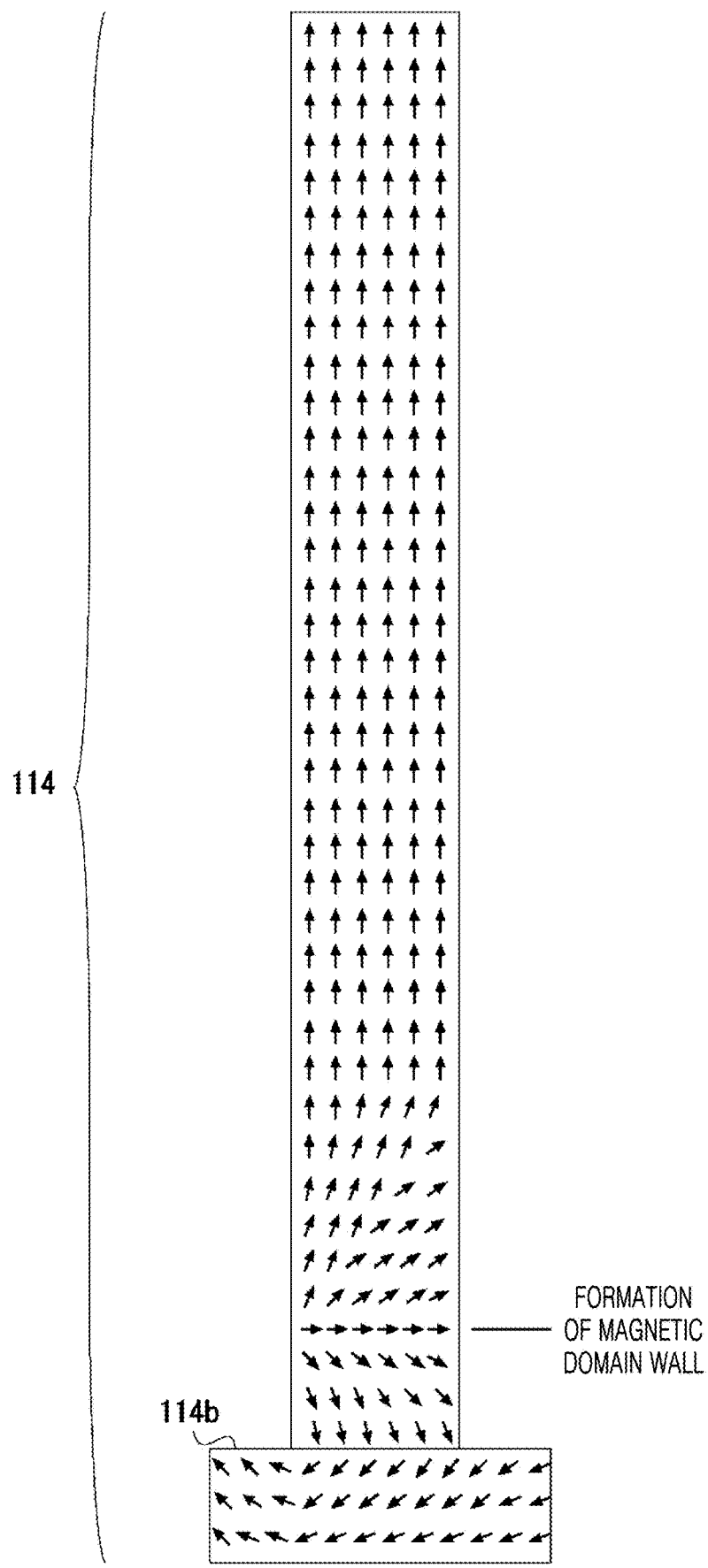
FIG. 10 is a view illustrating an example of a calculation result using the LLG equation.
Figure 11:
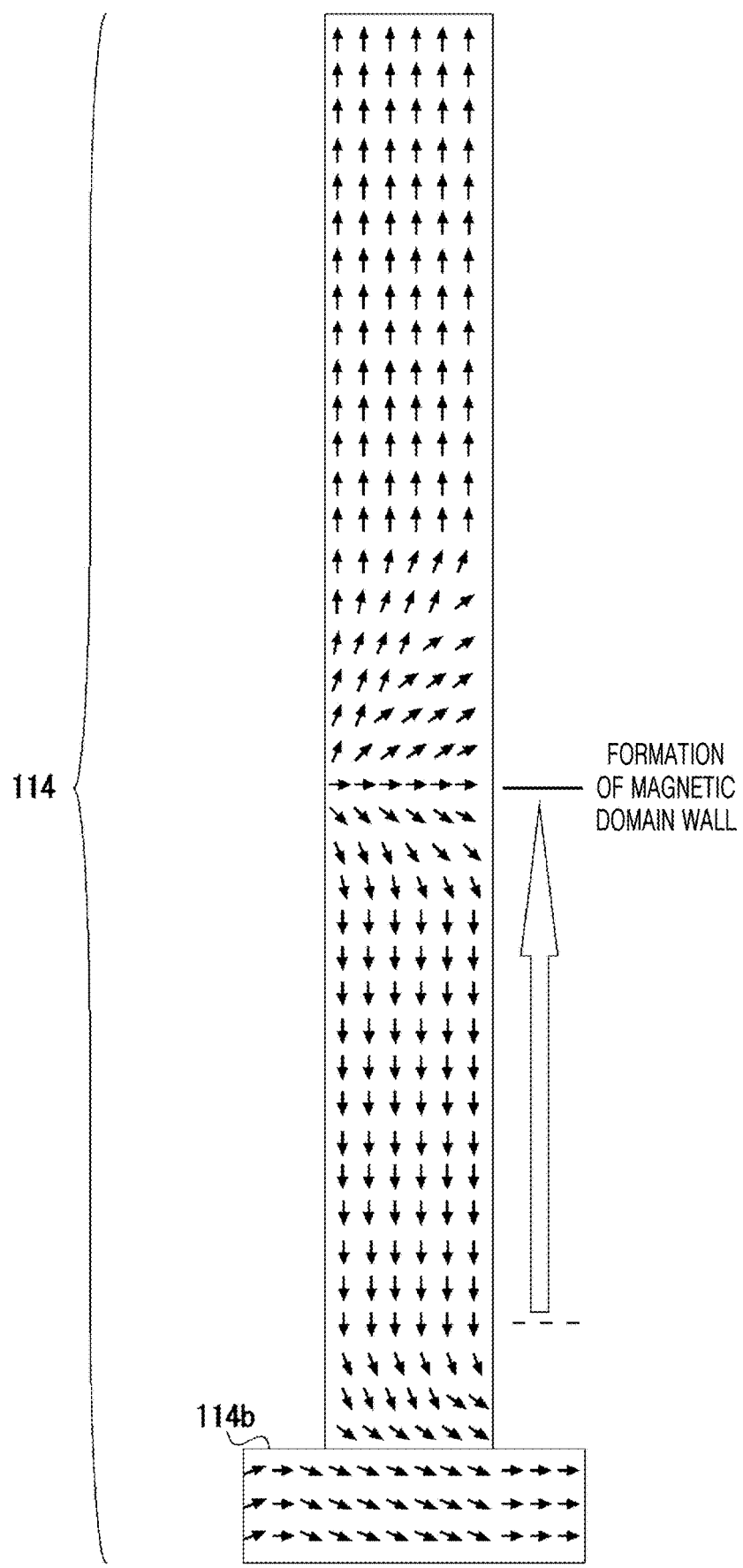
FIG. 11 is a view illustrating an example of a calculation result using the LLG equation.
Figure 12:
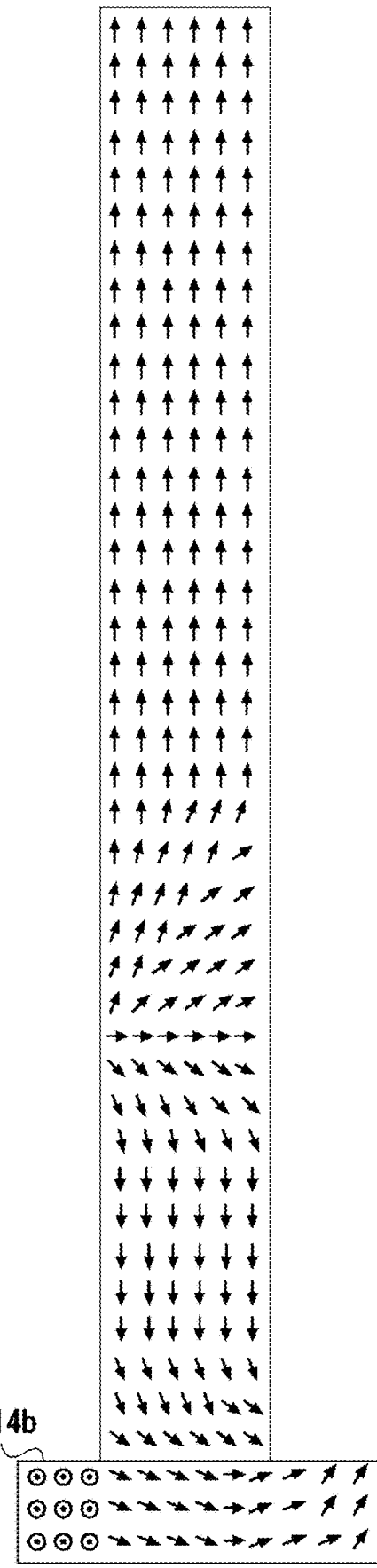
FIG. 12 is a view illustrating an example of a calculation result using the LLG equation.
Figure 13:
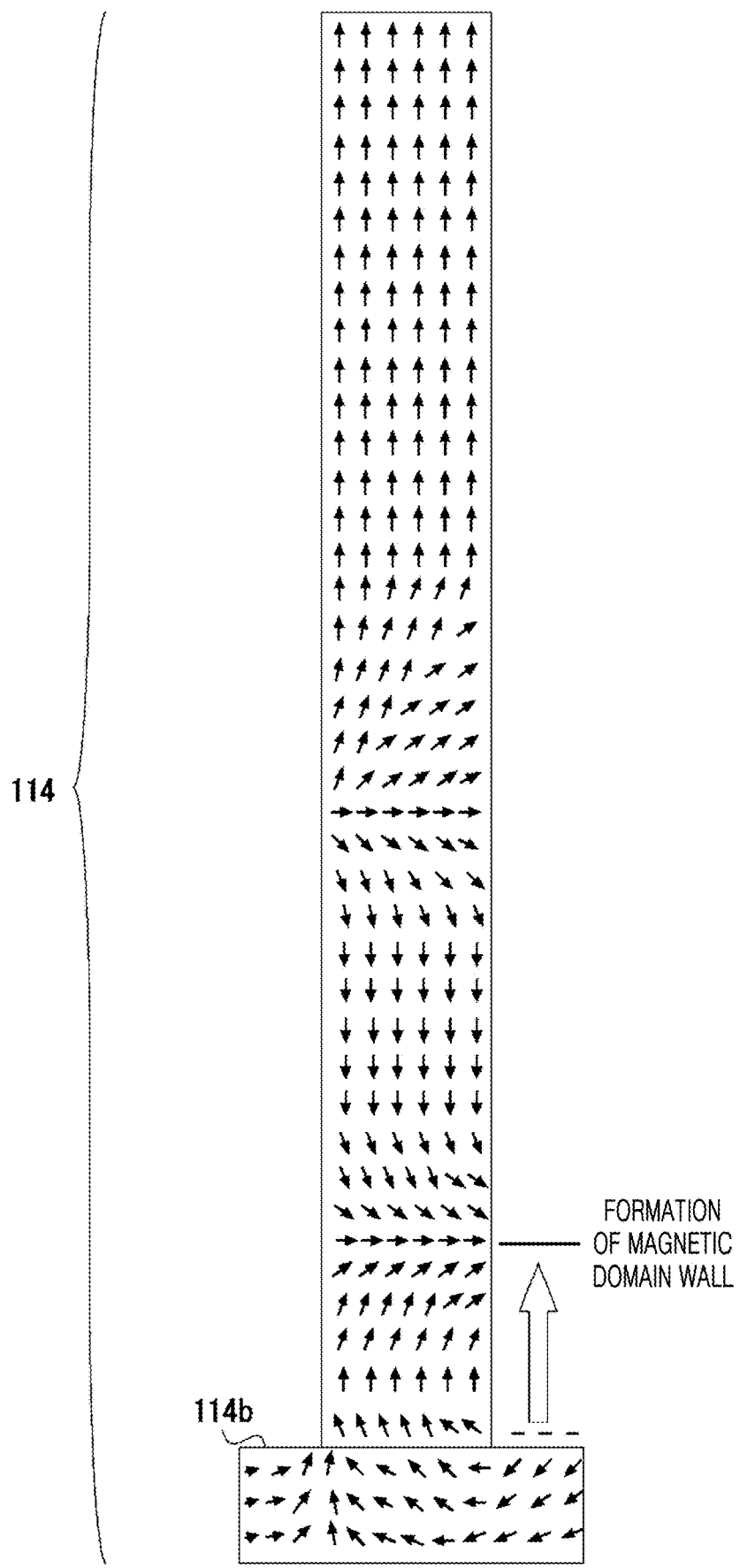
FIG. 13 is a view illustrating an example of a calculation result using the LLG equation.
Figure 14:
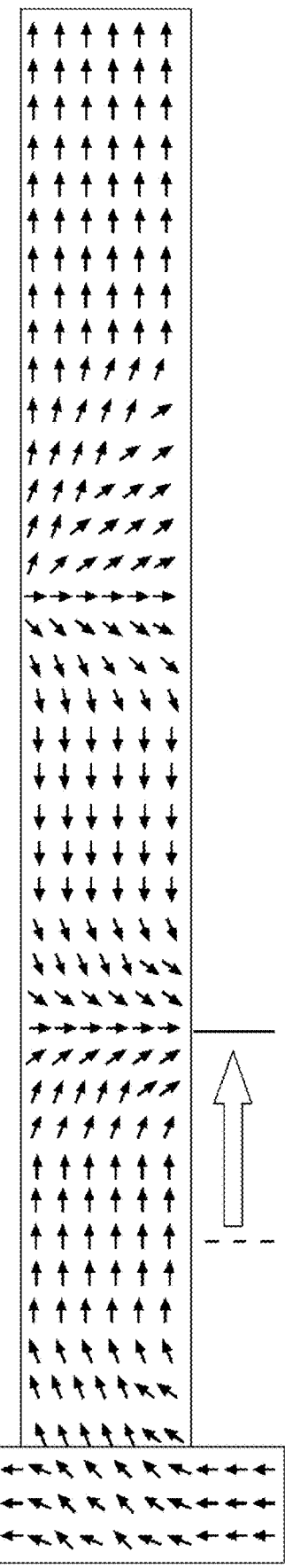
FIG. 14 is a view illustrating an example of a calculation result using the LLG equation.

Referring to FIGS. 8 to 10, by the SOT generated by the SOT source 111 (not shown), a magnetization direction of the lower portion 114b of the magnetic fine wire 114 changes and a magnetic domain wall is formed. In addition, referring to FIGS. 10 and 11, the magnetic domain wall moves in the magnetic fine wire 114 in a vertical direction. Referring to FIGS. 12 to 14, the magnetic domain wall moves in the magnetic fine wire 114, e.g. moves in a vertical direction. As described above, by generating the SOT in the lower portion 114b of the magnetic fine wire 114 and flowing a current to the magnetic fine wire 114, data may be recorded and moved.

By using conventional race track structure and magnetic fine wire, it is or may be necessary to provide an electrode for moving data, a recording fine wire for recording data, and a magnetic tunnel junction (MTJ) device for reading data. However, in the magnetic memory apparatus according to some example embodiments of inventive concepts, data may be recorded, moved, and read by a three-terminal structure.

Alternatively or additionally in the magnetic memory apparatus according to some example embodiments of inventive concepts, by recording information using the SOT wiring lines and the pillar-type magnetic fine wire and moving the information by a current, a magnetic device with high density, large capacity, and high reliability, which functions as large capacity non-volatile memory represented by a shift register reading information by using an MTJ or NAND flash memory or next generation V-NAND memory, may be provided.

In addition, inventive concepts are not limited to example embodiments illustrated in FIG. 1 and a change may be made without departing from the scope of inventive concepts. For example, in some example embodiments, the magnetic fine wire 114, the insulating layer 115, and the fixed layer 116 together form the TMR device. Alternatively or additionally, a GMR device may be formed by using a non-magnetic metal layer instead of the insulating layer 115.

Alternatively or additionally, in FIG. 1, the magnetic fine wire 114, the insulating layer 115, and the fixed layer 116 are illustrated as being cylindrical. However, the magnetic fine wire 114, the insulating layer 115, and the fixed layer 116 may have any shape if they may be stacked. For example, the magnetic fine wire 114, the insulating layer 115, and the fixed layer 116 may be square pillared or prismatic pillared.

While inventive concepts has been particularly shown and described with reference to some example embodiments thereof, it will be understood that various changes in form and details may be made therein without departing from the spirit and scope of the following claims.

What is claimed is:
1. A magnetic memory device comprising:
   a spin orbit torque (SOT) source configured to generate SOT; and
   a magnetic fine wire having an end contacting a main surface of the SOT source,
   wherein a direction of SOT generated by the SOT source is perpendicular to a direction in which the magnetic fine wire extends,
   a plurality of magnetic domains, in the magnetic fine wire, each of the plurality of magnetic domains corresponding to a uniform magnetic direction extending parallel to or antiparallel to the direction in which the magnetic fine wire extends, and
   the magnetic fine wire is configured to store a plurality of bits, each of the plurality of bits corresponding to respective ones of the plurality of magnetic domains, and each of the plurality of magnetic domains separated by a magnetic domain wall extending perpendicular to the extension direction of the magnetic fine wire.

2. The magnetic memory device of claim 1, wherein the SOT source comprises a non-magnetic material.

3. The magnetic memory device of claim 1, wherein the SOT source comprises a topological insulator.

4. The magnetic memory device of claim 1, wherein the SOT source comprises a ferromagnetic material.

5. The magnetic memory device of claim 1, wherein the magnetic fine wire comprises a ferromagnetic metal.

6. The magnetic memory device of claim 1, wherein the magnetic fine wire comprises at least one of a cobalt (Co)/nickel (Ni) multilayer, a CoNi-based alloy, a Co/palladium (Pd) multilayer, a CoPd alloy, a Co/Pt multilayer, a CoPt alloy, a terbium (Tb)/iron (Fe)Co multilayer, a TbFeCo alloy, a CoFe alloy, a CoFeB alloy, a Fe/Ni multilayer, or a FeNi alloy.

7. The magnetic memory device of claim 1, further comprising:
   a first electrode and a second electrode, the first electrode and the second electrode configured to flow a current to the SOT source in a direction perpendicular to a direction of the SOT; and
   a third electrode configured to flow a current to the magnetic fine wire in a direction parallel with the direction in which the magnetic fine wire extends.

8. The magnetic memory device of claim 7, further comprising:
   an insulating layer stacked on another end of the magnetic fine wire; and
   a fixed layer between the insulating layer and the third electrode.

9. The magnetic memory device of claim 7, further comprising:
   a non-magnetic metal layer stacked on the other end of the magnetic fine wire; and
   a fixed layer stacked on the non-magnetic metal layer.

10. The magnetic memory device of claim 9, wherein the fixed layer has perpendicular magnetic anisotropy.

11. The magnetic memory of claim 1, wherein
   a length of a one of the plurality of magnetic domains from a first one of the magnetic domain walls to a vertically neighboring second one of the magnetic domain walls corresponds to one of the plurality of bits as determined by a controller.

12. A magnetic memory apparatus comprising:
   a spin orbit torque (SOT) source extending in a horizontal direction;
   a first electrode at one end of the SOT source and a second electrode at another end of the SOT source;
   a magnetic fine wire extending on the SOT source in a direction perpendicular to the horizontal direction;
   at least one of an insulating layer or a non-magnetic metal layer, the insulating layer or the non-magnetic metal layer on an upper end of the magnetic fine wire;
   a fixed layer on the insulating layer or the non-magnetic metal layer;
   a third electrode on the fixed layer; and
   controller circuitry electrically connected to the first electrode, the second electrode, and the third electrode, wherein
   the controller circuitry is configured to move a magnetic domain in the magnetic fine wire upward by flowing a current between the first electrode and the third electrode.

13. The magnetic memory apparatus of claim 12, wherein the controller circuitry is configured to form a magnetic domain in a lower portion of the magnetic fine wire by flowing a current between the first electrode and the second electrode in a direction corresponding to recorded information.

14. The magnetic memory apparatus of claim 12, wherein the controller circuitry is configured to read a direction of magnetization of a magnetic domain at the upper end of the magnetic fine wire by applying a voltage between the first electrode and the third electrode and measuring a current flowing between the third electrode and the first electrode.

15. The magnetic memory apparatus of claim 12, wherein the controller circuitry is configured to read a direction of magnetization of a magnetic domain at the upper end of the magnetic fine wire by flowing a current between the first electrode and the third electrode and measuring a voltage between the first electrode and the third electrode.

16. A magnetic memory apparatus comprising:
   a spin orbit torque (SOT) source configured to generate SOT;
   a magnetic fine wire on the SOT source;
   a first electrode and a second electrode, the first electrode and the second electrode configured to flow a current to the SOT source in a direction perpendicular to a direction of the SOT;
   a third electrode configured to flow a current to the magnetic fine wire in a direction parallel to a direction in which the magnetic fine wire extends; and
   controller circuitry connected to the first electrode, the second electrode, and the third electrode,
   wherein the controller circuitry is configured to flow a current between the first electrode and the third electrode during a magnetic domain moving operation.

17. The magnetic memory apparatus of claim 16, wherein the controller circuitry is configured to flow a current between the first electrode and the second electrode in a direction corresponding to recorded information during a recording operation.

18. The magnetic memory apparatus of claim 16, wherein the controller circuitry is configured to apply a voltage between the first electrode and the third electrode and to measure a current flowing between the third electrode and the first electrode during a read operation.

19. The magnetic memory apparatus of claim 16, wherein the controller circuitry is configured to flow a current between the first electrode and the third electrode and to measure a voltage between the first electrode and the third electrode during a read operation.

* * * * *